United States Patent [19]

Erb

[11] 4,413,402
[45] Nov. 8, 1983

[54] METHOD OF MANUFACTURING A BURIED CONTACT IN SEMICONDUCTOR DEVICE

[75] Inventor: Darrell M. Erb, Los Altos, Calif.

[73] Assignee: Advanced Micro Devices, Inc., Sunnyvale, Calif.

[21] Appl. No.: 313,569

[22] Filed: Oct. 22, 1981

[51] Int. Cl.³ .......................................... H01L 21/265
[52] U.S. Cl. .................................. 29/571; 29/576 B; 29/578; 148/1.5
[58] Field of Search ................. 29/571, 576 B, 578; 427/93; 148/1.5

[56] References Cited

U.S. PATENT DOCUMENTS

| | | | |
|---|---|---|---|
| 3,673,679 | 7/1972 | Carajal | 29/571 |
| 3,691,627 | 9/1972 | Engeler | 29/571 |
| 3,996,657 | 12/1976 | Simko | 29/571 |
| 4,219,379 | 8/1980 | Athanas | 29/571 |
| 4,271,582 | 6/1981 | Shirai | 29/571 |
| 4,294,002 | 10/1981 | Jambotkar | 29/571 |
| 4,299,862 | 11/1981 | Donley | 29/571 |
| 4,318,216 | 3/1982 | Hsu | 29/576 B |

OTHER PUBLICATIONS

"A New Self-Aligned Contact Technology", Tanigaki, Y., *Solid-State Science and Technology*, J. Electrochem. Soc., Mar. 1978, pp. 471–472.

*Primary Examiner*—L. Dewayne Rutledge
*Assistant Examiner*—J. J. Zimmerman
*Attorney, Agent, or Firm*—Gary T. Aka; Patrick T. King

[57] ABSTRACT

Method of forming buried contact in recessed gate MOSTEK technology is provided. When the buried contact is desired, a MOS transistor is formed and the gate and underlying gate oxide layer removed to expose the substrate. A conducting layer through the aperture formed makes contact to the substrate.

10 Claims, 20 Drawing Figures

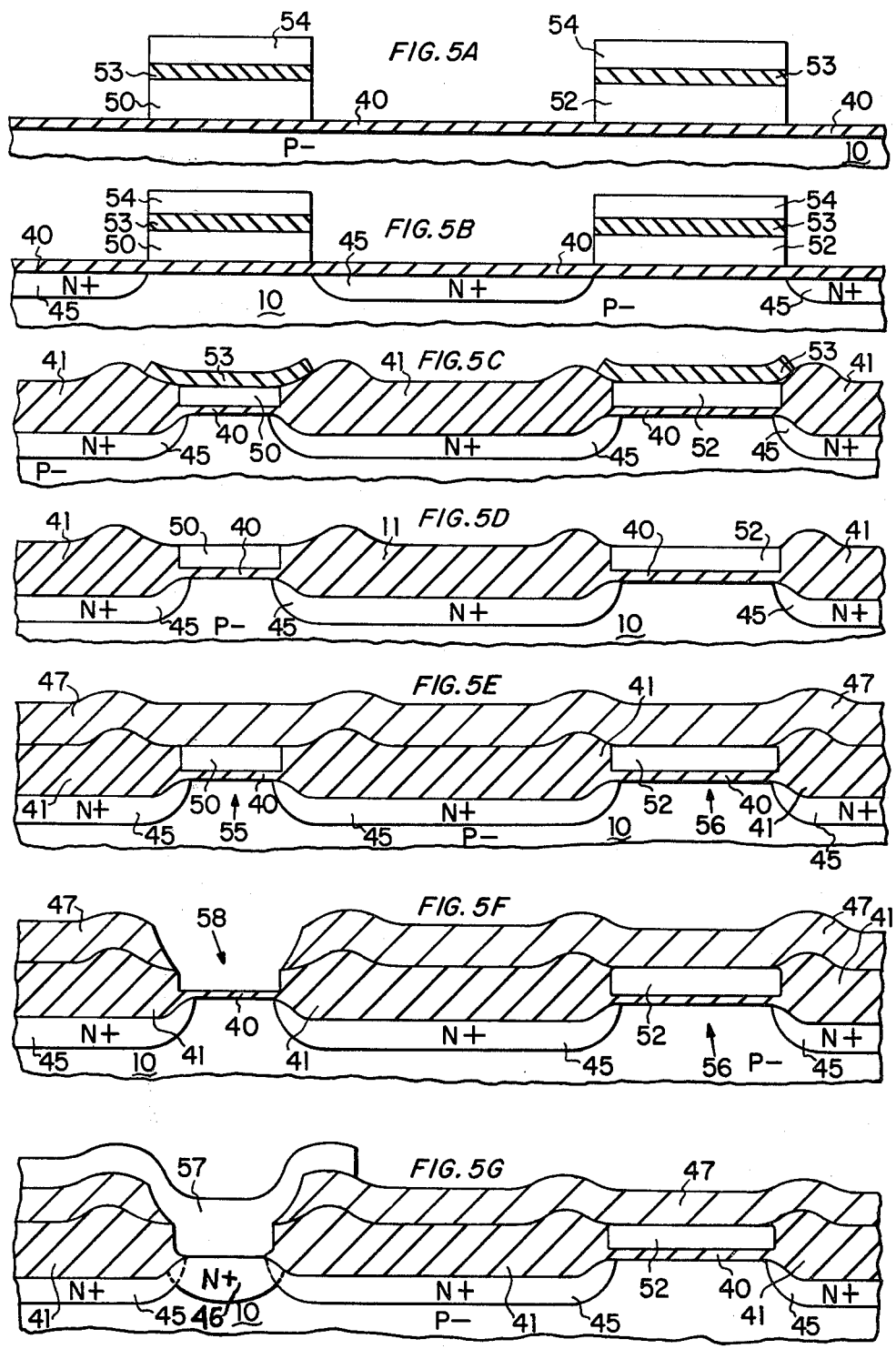

METHOD OF MANUFACTURING A BURIED CONTACT IN SEMICONDUCTOR DEVICE

BACKGROUND OF THE INVENTION

The field of this invention relates to a method of manufacturing integrated circuit devices, and more particularly, to a technique of manufacturing buried contacts in recessed gate MOSFET semiconductor devices.

As used herein, the term "recessed gate" MOS device refers to a field effect transistor having a thick oxide layer over its source and drain regions. This is a more expansive use of the term than that by V. L. Rideout and D. J. Silvestri in their paper, "MOSFET's With Polysilicon Gates Self-Aligned to the Field Isolation and to the Source and Drain Regions," IEEE Transactions on Electron Devices, Vol. ED-26, No. 7, July 1979, pp. 1047–1052, and the reference cited therein. In Rideout and Silvestri paper the term refers to a particular MOSFET device structure in which the silicon gate is doubly self-aligned with respect to the field regions and to the source and drain regions of the device.

The present invention, on the other hand, is directed toward a problem related to any MOS transistor in which a thick oxide, like that in the field regions of the integrated circuit, is used to also cover the source and drain regions of the transistor.

What is common to the recessed gate technology is a problem of making electrical contact to the conducting regions in the substrate, normally defined by the source/drain mask in process. This is the problem of the buried contact.

A straightforward solution is to place the contact apertures within the source/drain regions of the integrated circuit as viewed from above. However, to ensure that the contact mask defines contact regions entirely within the source/drain regions, the source/drain regions must be widened. This will protect against the expected variations in mask alignments during processing. But the widening of the source/drain regions lessens the maximum packing density of the integrated circuit for a given photolithographic technology.

A second drawback to this solution is that in the recessed gate technology, a thick thermal oxide at several thousands Angstroms is grown over the source/drain regions. Etching consistent and accurate contact apertures as defined by the contact mask through such thick oxide layers is difficult.

Other solutions to this problem have also various shortcomings for reasons discussed below. The present invention, by its novel approach, avoids these shortcomings and is a significant advance over the prior art.

SUMMARY OF THE INVENTION

The present invention provides for a method of manufacturing a semiconductor structure comprising forming a first insulating layer on a semiconductor substrate, forming a conductor layer over the first insulating layer and defining it into a preselected portion, implanting a first dopant into a preselected region of the substrate to create a conducting region and using the defined conductor portion as a mask for the dopant, forming a second insulating layer over the preselected region, forming an aperture through the conductor portion and the first insulating layer to expose the substrate, forming a conducting layer over the second insulating layer and through the aperture to contact the substrate so that a buried contact to the substrate for electrical connection to the conducting region is formed.

The second insulating layer may be formed by growing the first insulating layer covering the substrate in an oxidizing atmosphere. Additionally, a third insulating layer may be formed, typically, by chemical vapor deposition, over the second insulating layer and the conductor portion and below the conducting layer. The third insulating layer has an aperture over the aperture through the conductor portion and first insulating layer to provide a via for the conducting layer to contact the substrate.

Complete electrical contact to the conducting region in the substrate may be achieved by diffusing a second doped from the conducting layer to the conducting region by using dopant polysilicon for the conducting layer. Alternatively, the third insulating layer containing the second dopant may be deposited over the second insulating layer and conductor portion after the aperture to the substrate is formed. The third insulating layer contacts the substrate and acts as a source of the second dopant to diffuse to the conducting region through the substrate. Then an aperture in the third conducting layer is formed to reopen the aperture to the substrate and the conducting layer deposited.

BRIEF DESCRIPTION OF THE DRAWINGS

An understanding of the present invention may be obtained by a perusal of the following Detailed Description of the specification and by reference to the drawings below:

FIGS. 5A to 5G represent a cross-sectional view of the manufacturing steps of the present invention.

DETAILED DESCRIPTION

A problem in recessed gate technology is how to attain a secure electrical contact to the conducting regions of the semiconductor, i.e., the problem of the buried contact. As discussed above, the straightforward solution of placing the contact apertures within the conducting regions of the substrate, as viewed from above, has certain drawbacks.

Figure 1:
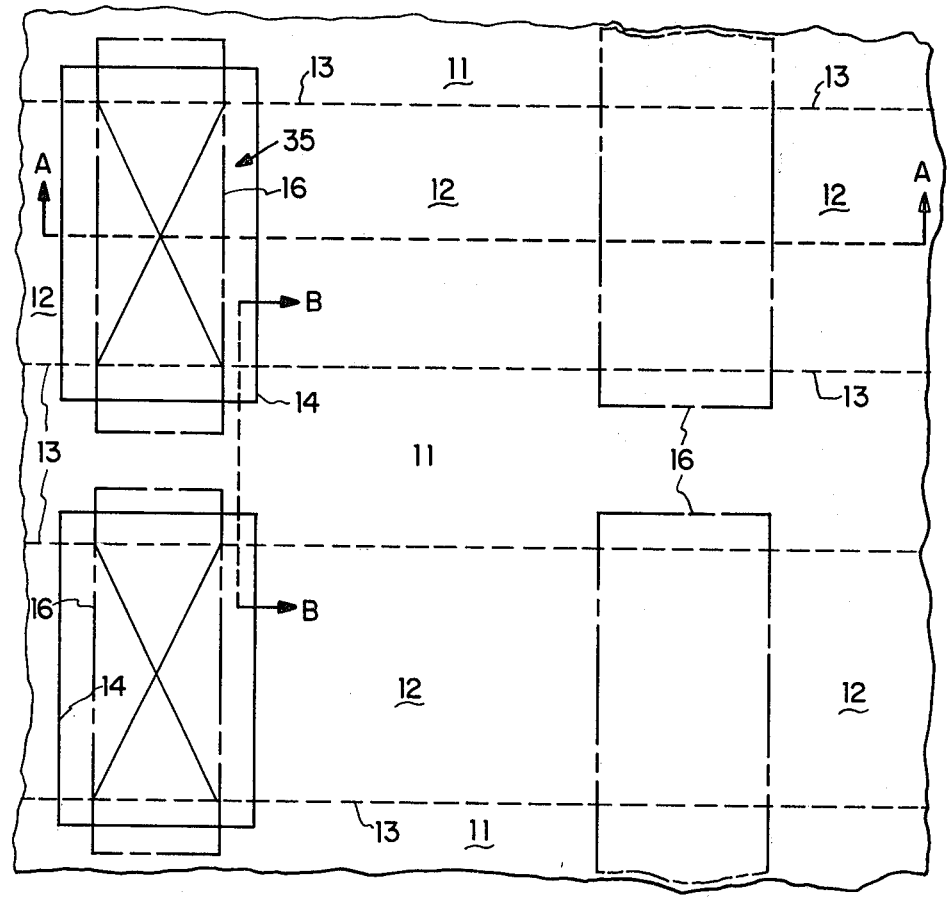
FIG. 1 represents a plan view of an exemplary pair of recessed gate MOS transistors and the various masks used to form them with buried contacts by a present manufacturing process.

FIGS. 1 and 2 illustrate another technique which has been used to create buried contacts in recessed gate MOS integrated circuits. This approach is an advance over the straightforward solution, but it still has certain disadvantages, which will become manifest below.

FIG. 1 is a plan view of a pair of adjacent MOS devices on part of a semiconductor substrate 10 as might be found in a typical MOS integrated circuit. The different lines outline the masks used to form these devices with buried contacts, by a present recess gate process.

FIG. 2 shows along line A—A in FIG. 1 the various steps in the manufacturing process used presently.

Before the steps of forming the MOS transistor and buried contact proceed, the substrate 10 of lightly-doped P-type silicon is prepared by creating the field isolation of the integrated circuit. The dashed lines 13 of FIG. 1, which demarcate the source/drain mask of the manufacturing process, separate the field regions 11 from the active, or source/drain, regions 12. A layer of P-type dopants, such as boron, is formed at the surface of the substrate 10 in the field regions 11 and a thick oxide layer is grown over the field regions 11. A thin oxide layer 20 covers the active, or source/drain, regions 12. The field isolation is now formed to prevent undesired parasitic channeling between the active regions 12, the field regions 11 electrically isolate the regions 12 from each other. This field isolation technique is well-known in the semiconductor processing art.

Figure 2A:
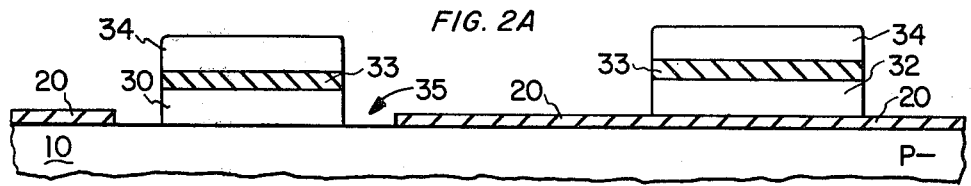
FIGS. 2A to 2F show the manufacturing process steps used to form recessed gate MOS transistor and buried contact shown in FIG. 1. The view shown is along line A—A in FIG. 1.

To form the buried contact to the substrate 10 a buried contact mask, outlined by the lines 14 and extending into the field regions 11, is used to cut through the thin oxide layer 20, which will form the gate oxide of the transistor, as shown in FIG. 2A. Typically this buried contact mask is formed by first covering the entire device with a photoresist layer and subsequently defining an aperture enclosed by the lines 14. The oxide layer 20 below the aperture is etched away leaving the region bounded by the lines 13 and 14 exposed. Note that even though the contact mask outlined by the line 14 overlaps onto the field regions 11, the field oxide is of such thickness as compared to the thin gate oxide 20 that it still covers the substrate 10 even after the active regions 12 are exposed by the etching.

Subsequently a conducting layer of polysilicon is deposited over the entire substrate followed by a layer of silicon nitride 33 and another photoresist layer 34. Using the polysilicon mask as outlined by the lines 16, the gate electrode 32 of the transistor is defined and the polysilicon layer portion 30 forming the buried contact is defined. FIG. 2A illustrates the state after which the photoresist layer 34 has been defined so that the underlying layers of silicon nitride 33 and the polysilicon layer have been etched so as to form the gate electrode 32 and buried contact polysilicon portion 30.

Figure 2B:
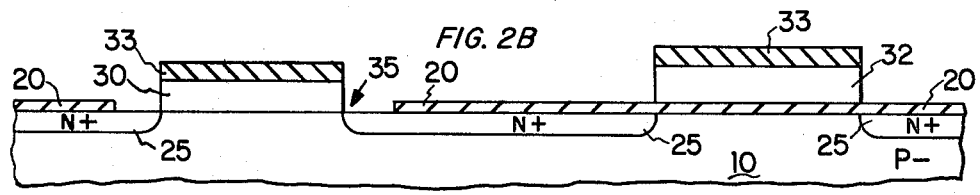
Figure 2C:
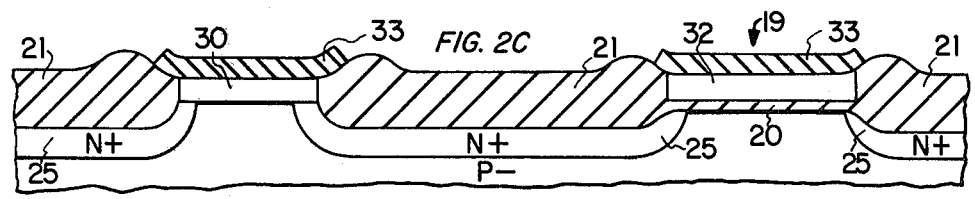

It should be noted that the polysilicon mask is aligned with respect to the source drain mask outlined by the line 14 so that an open region 35 is formed between the contact electrode 30 and the gate oxide layer 20. This is done to ensure that the polysilicon 30 does not overlap onto the gate oxide 20 to avoid the undesired formation of an MOS transistor in the buried contact region. A fuller explanation of the open region 35 follows. After the definition of the polysilicon layer into its different parts, an implant of an N-type dopant, such as arsenic, is performed. This is illustrated in FIG. 2B with the gate electrode 32 and the contact electrode 30 and the overlying photoresist layer 34 acting as a mask. The source and drain regions of the transistor 19 are formed by implant layers 25.

Then the photoresist layer 34 is stripped off and the substrate 10 is placed in an oxidizing atmosphere. Since the polysilicon layer parts 30 and 32 are shielded by the nitride layer 33, while the rest of these areas are exposed, the portions of the thin oxide layer 20 above the active regions 12 grow into a thick oxide layer 21 which grow into the substrate 10 with the source/drain regions 25 below. The growth of oxide layer 21 is such that the gate electrode 32 becomes laterally surrounded by the layer 21 over the source/drain regions 25 so as to be "recessed" in the oxide, hence, the name of the technology. The thin oxide layer 20 remains only as a gate oxide layer below the polysilicon gate electrode 32 for the MOS transistor 19. Since the sides of the polysilicon electrodes 30, 32 are exposed, they also are partially oxidized as illustrated by the extension of the silicon nitride layer 33 beyond the layers 30, 32. Around the transistor 19 are the characteristic bumps or "bird's beak" in the oxide 21.

Figure 2D:
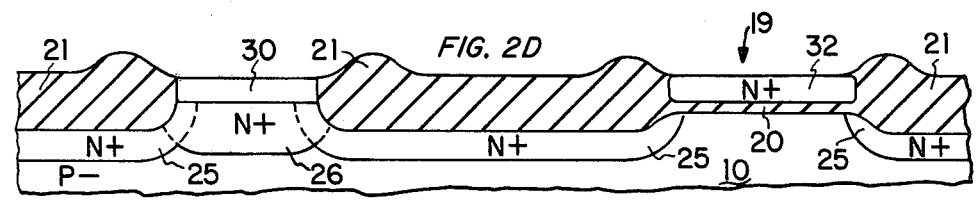
Figure 2E:
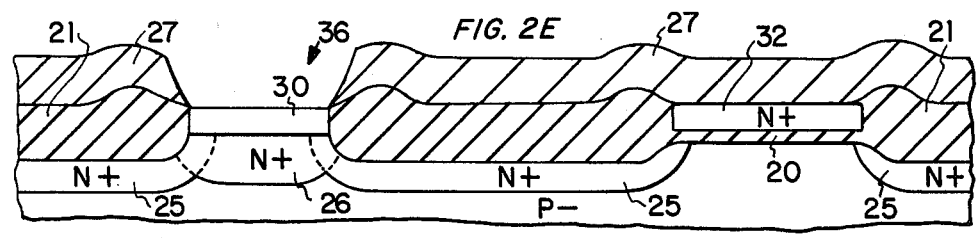

On the contact region to the source (or drain) of the transistor 19, the contact electrode 30 is similarly formed as the gate electrode 32. The chief difference being that the electrode 30 rests upon the silicon substrate 10 on the region indicated by the "X" in FIG. 1 without an intervening oxide layer 20. FIG. 2D shows a step of the process in which the silicon nitride layer 33 is stripped off and the polysilicon electrodes 30 and 32 are exposed to an N-type dopant either by diffusion or by implantation. The electrodes 31 and 32 become heavily doped and the silicon substrate 10 under the electrode 31 becomes doped also forming a diffusion region 26. This region 26 is created by the diffusion of the dopants from the electrode 31 to the source/drain regions 25.

Figure 2F:
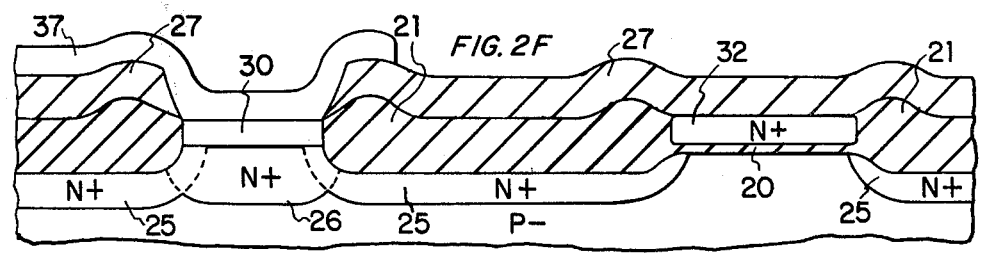

After this step, a phosphorous doped insulating oxide layer 27 is formed over the substrate by vapor deposition and an aperture 36 is formed over the electrode 30. FIG. 2F shows a conducting line 37 formed over the layer 27 and into the aperture 36 to contact the buried contact electrode 30. This conducting layer 37 can be either metal or another layer of N-doped polysilicon.

One of the chief problems in this process for making a buried contact is that a masking and etching step is performed on the thin oxide layer 20. The buried contact mask as demarcated by the line 14 requires that the areas outside of the area bounded by the line 14 be covered with a photoresist material. Then the aperture defined by the buried contact mask is created, followed by the etching of the oxide layer 20. Then the remaining photoresist is stripped off. Since the oxide layer 20 is thin, it can be easily damaged by this steps. For example, if all of the photoresist is not stripped off, then, especially in the area underneath the transistor gate electrode, pinholes in this gate oxide may be formed. This results in the short circuiting of the MOS transistor 19. Another problem is that the quality of the subsequent polysilicon deposition may be reduced due to residual contamination.

Another problem related to this manufacturing process is that the polysilicon mask defined by the lines 16 must be aligned with the buried contact mask as delineated by the lines 14 so that an open region 35 is formed between the edge of the gate oxide 20 and the contact electrode 38. This is illustrated by FIGS. 2A and 2B. This requirement ensures that an undesired MOS transistor is not formed by the contact electrode 30 if the electrode were formed over the thin oxide 20. If such a thing happens, the implanted source/drain regions 25, being lined with the edge of the contact electrodes, from an MOS transistor having a channel region between the edge of the region 25A and the region where the polysilicon 30 comes in contact with the substrate 10. Viewed as a MOS transistor, the silicon layer 30 and the contact region as one of the terminals of this undesired transistor would be at the same voltage. No current would pass through this contact, defeating the purpose of the manufactured structure. Accordingly, to avoid this problem it is desirable that an exposed region 35 be designed to ensure that the edge of the electrode 30 toward the transistor 19 is in contact with the substrate 10.

Figure 3A:
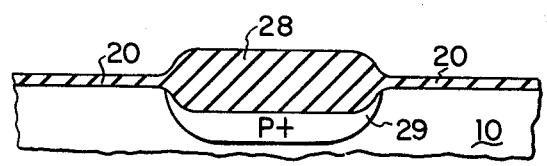
FIGS. 3A to 3C illustrate the present day manufacturing process along line B—B of FIG. 1. The illustrations represent the ideal result.
Figure 3B:
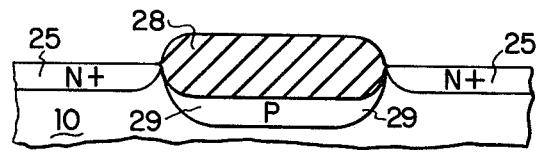
Figure 3C:
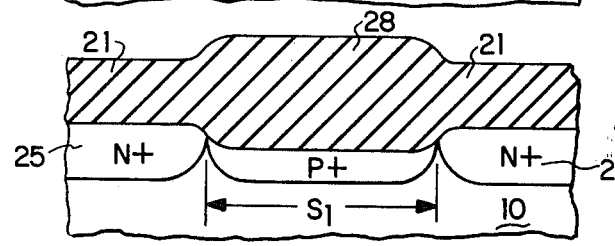

However, it has been noted that by the etching of the polysilicon layer to define the contact electrode 30 as defined by the photoresist mask 34 and the underlying nitride layer 33, some gouging of the silicon substrate 10 will occur. FIGS. 3A to 3C illustrate the ideal processing steps along line B—B of FIG. 1 in which no gouging occurs. What is more typical in everyday processing is that some gouging of the substrate 10 will occur since the substrate 10 remains unprotected as the polysilicon layer 30 is defined by etching.

Figure 4A:
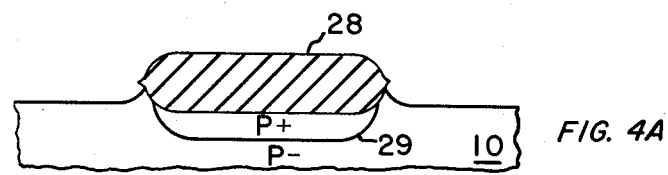
FIGS. 4A to 4C shows a problem of the process which may occur instead of the ideal case in FIGS. 3A to 3C.
Figure 4B:
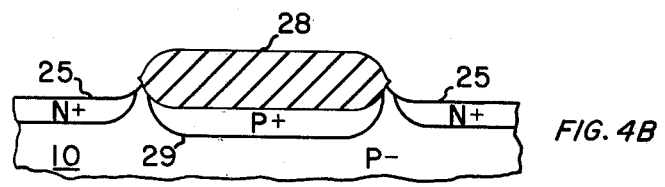
Figure 4C:
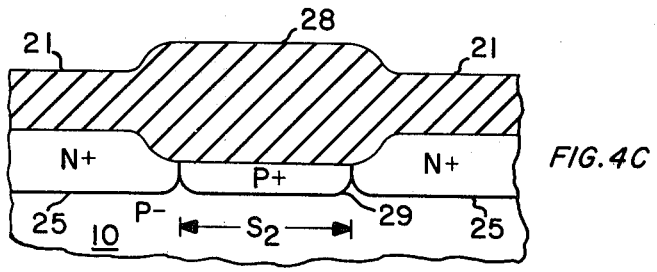

FIGS. 4A to 4C can show the results of substrate gouging. In FIG. 4A the preliminary field oxide 28 covers the field implant region 29, which is use to prevent channeling between adjacent active regions 12A and 12B. Then the source/drain region 25 are formed by implantation into the active regions 12. FIG. 4B illustrates this state. Then the source/drain regions 25 are oxidized to form the heavy oxide layer 21 over these implanted conducting regions 25. The field oxide 28 increases slightly to form the final field oxide layer 28. What is significant is that the resulting structure illustrated in 4C has a much shorter separation length $S_2$, as compared to the ideal structure in FIG. 3C having a separation length $S_1$. This is due to the fact that the gouging has reduced the distances between adjacent source/drain regions 25. With the reduction in separation between these regions, a greater likelihood of parasitic channeling may occur as compared to the idealized structure in FIG. 3C. The idealized structure has the field implant layer 29 separating in the conducting N+ regions 25 and the thick oxide layer 28 for electrical isolation. The gouged structure leads to electrical isolation with only the structural field implant layer 29.

The present invention solves this problem of the buried contact for recessed gate MOS transistors in a novel manner in which the problems of ruining the gate oxide and gouging the substrate are removed. FIGS. 5A to 5G illustrate the process steps of an embodiment of the present invention. After the field regions 11 are formed with the gate oxide layer 40 in the active regions 12, as described previously, a conductor layer of polysilicon is deposited over the substrate with a silicon nitride layer 53 and a photoresist layer 54. No buried contact mask as demarcated by the line 14, in FIG. 1 is used, but rather the polysilicon mask as demarcated by the dotted line 16 is defined on the photoresist layer 54 and underlying nitride layer 53 and the polysilicon layer. FIG. 5A shows the active region of the device with the polysilicon layer defined, the gate electrode layer 52 and the polysilicon layer 50. Subsequently, an implant of arsenic is made to generate a preliminary source/drain region 45 with the photoresist layer 54 and polysilicon layers 50, 52 acting as a mask to block the implant into the substrate below. After the photoresist 54 is stripped off the substrate 10 is placed into an oxidizing atmosphere to thicken the thin oxide layer 40 into a source/drain thermal oxide 41 which allows the gate electrode 52 to be recessed into the oxide. The layer 40 in the range of 300–500 Angstroms is thickened to 5,000–7,000 Angstroms, typically. As noted before, the edges of the polysilicon layers 50 and 52 are oxidized around their edges. The preliminary gate oxide layer 40 now has been grown into the source/drain oxide regions 41 with the MOS gate layers 40 remaining under the electrodes 50 and 52 for two MOS transistors 55, 56. The structure is illustrated in FIG. 5C.

FIG. 5D illustrates the structure after the oxide masking silicon nitride layer 53 has been removed. Subsequently, a phosphorous doped oxide glass layer is deposited by vapor deposition to form a layer 47 over the substrate as illustrated in FIG. 5E. A reflow step follows by which the layer 47 is reheated to melt into a smoother surface.

Then, by a mask of photoresist which may be coincident with contact mask of FIG. 1, a hole 58 over one of the MOS transistors is formed through the glass layer 47. Then the underlying polysilicon layer 50 is etched and the thin gate oxide layer 40 below is etched away. It should be pointed out that this aperture is self-aligned with the source/drain region by using the differential etching rates of specific etchants for polysilicon versus silicon dioxide and taking advantage of the fact that the gate oxide layer is so thin. A diffusion region 46 to the source/drain region 45 may be formed by introducing an N-type dopant, such as phosphorous, directly through the aperture 58 at this point. Finally, as shown in FIG. 5G, a conducting layer, either of metal, such as aluminum, or another layer of polysilicon, is placed over the substrate and defined into a conducting line 57 after the photoresist material which has defined the aperture 58 has been stripped. If polysilicon is selected, the diffusion region 46 may be created by dopant diffusion from the conducting line 57 into the substrate 10.

An alternative embodiment of the present invention is to etch away the polysilicon 50 and underlying gate oxide layer 40 before the vapor deposition layer 47 is put down. After the deposition step the reflow step of the phosphorous doped vapor deposited oxide is performed and then the buried contact aperture is etched through the glass layer 47. Subsequently a conducting layer of polysilicon or metal is formed and defined by another masking step. This alternative embodiment is particularly useful for a metal contact since the preceding reflow step for the vapor deposited glass layer 47 dopes the exposed semiconductor surface with phosphorous to form the diffusion region 46 to the conducting regions 45 before the metal layer is deposited.

In the manner above, a buried contact may be made to a conducting region in a semiconductor substrate despite a covering of thick thermal oxide. The example above results in MOSFETs having an aligned buried contact to one of the transistor's source/drain regions.

Furthermore, the technique described is also applicable to doubly self-aligned MOSFET structure disclosed in the Rideout and Silvestri paper, cited above.

Accordingly, while the invention has been particularly shown and described with reference to the preferred embodiments, it would be understood by those skilled in the art that changes in form and details may be made therein without departing from the spirit of the invention. It is therefore intended that an exclusive right be granted to the invention as limited only by the metes and bounds of the appended claims.

What is claimed is:

1. A method of manufacturing a semiconductor structure comprising:
forming a first oxide layer over a silicon substrate,
forming at least one polysilicon gate electrode on said first oxide layer,
implanting dopant ions into said substrate using said gate electrode as a mask so that said dopant forms a source/drain region in said substrate with respect to said gate electrode to create a MOSFET structure, thickening said first insulating layer not covered by said gate electrode by oxidation to a thickness so as to surround said gate electrode, etching said gate electrode so as to expose said first insulating layer therebelow, etching said exposed first insulating layer to expose said substrate, introducing a second dopant into said exposed substrate to diffuse through said substrate to said source/drain region, forming a conducting lead over said thickened first insulating layer to contact said exposed substrate, whereby a buried contact to said source/drain region is formed.

2. The method as in claim 1 further comprising the steps of:

depositing a second insulating layer on said thickened first insulating layer and said gate electrode, etching an aperture through said second insulating layer over said gate electrode location and said conducting lead formation step further comprises, forming said conducting lead on said second insulating layer, through said second insulating layer, through said first insulating layer aperture to contact said exposed substrate.

3. The method as in claim 2 as herein said conducting lead comprises polysilicon doped with said second dopant, said second dopant introduction step being performed by the diffusion of said second dopant from said polysilicon to said source/drain region.

4. The method as in claim 2 wherein said gate electrode etching step and said first insulating layer etching step are performed before said second insulating layer deposition step, so that second insulating layer contacts said exposed substrate, said second insulating layer comprising silicon dioxide doped with said second dopant and said second dopant introduction step being performed by the diffusion of said second dopant from said second insulating layer to said source drain region.

5. The method or in claim 4 wherein said conducting lead comprises metal.

6. A method of manufacturing a MOSFET device comprising:

growing a first oxide layer on a semiconductor substrate, depositing a first layer of polysilicon on said first oxide layer, depositing a layer of oxidation resistant layer over said polysilicon layer, masking and etching said oxidation resistant layer into two gate electrode portions, etching said polysilicon layer into two gate electrodes, said gate electrode portions of said oxidation resistant layer forming a mask to define said gate electrodes thereunder, implanting a first dopant into said substrate using said gate electrodes as mask to create two MOSFET structures having a common source/drain region therebetween, thickening said first oxide layer not covered by said gate electrodes to a thickness so as to laterally surround said gate electrodes, removing said oxidation resistant layer gate electrode portions to expose said gate electrodes, depositing a second oxide layer over said first oxide layer and said gate electrodes, etching an aperture through said second oxide layer to a preselected one of said gate electrodes, etching said preselected gate electrode to expose said first oxide layer therebelow, etching said exposed first oxide layer to expose said substrate, depositing a second layer of polysilicon over said second oxide layer to contact said exposed substrate, doping said second polysilicon layer with a second dopant being of the same polarity type as said first dopant so that said second dopant diffuses from said second polysilicon layer to said common source/drain region, defining said second polysilicon layer into a lead contacting said exposed substrate by masking and etching, whereby a buried contact is formed to said common source/drain region of said MOSFET structure having the unselected gate electrode.

7. The method as in claim 6 wherein said oxidation resistant layer comprises silicon nitride and said second oxide layer deposition layer step comprises vapor deposition of silicon dioxide.

8. A method of manufacturing MOSFET devices comprising:

growing a first oxide layer on a semiconductor substrate, depositing a first layer of polysilicon on said first oxide layer, depositing a layer of oxidation resistant layer over said polysilicon layer, masking and etching said oxidation resistant layer into two gate electrode portions, etching said polysilicon layer into two gate electrodes, said gate electrode portions of said oxidation resistant layer forming a mask to define said gate electrodes thereunder, implanting a first dopant into said substrate using said gate electrodes as mask to create two MOSFET structures having a common source/drain region therebetween, growing said first oxide layer not covered by said gate electrodes to a thickness so as to surround said gate electrodes, removing said oxidation resistant layer gate electrode portions to expose said gate electrodes, etching a preselected one of said gate electrodes to expose said first oxide layer therebelow, etching said exposed first oxide layer to expose said substrate, depositing a second oxide layer over said first oxide layer, said gate electrodes and said exposed substrate, said second oxide layer comprising a second dopant, being of same polarity type as said first dopant, to diffuse through said exposed substrate to said common source/drain region, etching an aperture through said second oxide layer over said preselected etched gate electrodes to expose said substrate, depositing a conducting layer over said second oxide layer to contact said exposed substrate, defining said conducting layer into a lead contacting said exposed substrate by masking and etching, whereby a buried contact is formed to said common source/drain region of said MOSFET structure having the unselected gate electrode.

9. The method as in claim 8 wherein said oxidation resistant layer comprises silicon nitride and said second oxide layer deposition layer step comprises vapor deposition of silicon oxide.

10. The method as in claim 8 wherein said conducting layer comprises metal.

* * * * *